United States Patent
Fuchigami et al.

[19]

[11] Patent Number: 6,081,005
[45] Date of Patent: Jun. 27, 2000

[54] SEMICONDUCTOR INTEGRATED CIRCUIT

[75] Inventors: Chikashi Fuchigami; Tsutomu Kato; Hidetoshi Ikeda; Yoshio Iihoshi, all of Miyazaki, Japan

[73] Assignee: Oki Electric Industry Co., Ltd., Tokyo, Japan

[21] Appl. No.: 09/083,887

[22] Filed: May 26, 1998

[30] Foreign Application Priority Data

May 26, 1997 [JP] Japan .................................. 9-135501

[51] Int. Cl.[7] .................................................. H01L 27/10
[52] U.S. Cl. .......................... 257/208; 257/211; 257/659; 257/758; 257/760; 257/773; 438/597; 438/599
[58] Field of Search ..................................... 257/659, 211, 257/758, 760, 208, 773; 438/597, 599

[56] References Cited

U.S. PATENT DOCUMENTS

| | | | |
|---|---|---|---|
| 4,514,749 | 4/1985 | Shoji ....................................... | 357/68 |
| 4,958,222 | 9/1990 | Takakura et al. ......................... | 357/84 |
| 5,160,997 | 11/1992 | Sandoh et al. .......................... | 257/207 |
| 5,309,015 | 5/1994 | Kuwata et al. .......................... | 257/659 |
| 5,594,279 | 1/1997 | Itou et al. ................................ | 257/758 |
| 5,602,406 | 2/1997 | Okabe ..................................... | 287/207 |
| 5,949,098 | 9/1999 | Mori ........................................ | 257/211 |

*Primary Examiner*—William Mintel
*Attorney, Agent, or Firm*—Jones Volentine, LLP

[57] ABSTRACT

The present invention is a semiconductor integrated circuit capable of reducing a cross talk noise produced between data buses. A typical semiconductor integrated circuit of the present invention comprises a plurality of data buses which are formed in an insulating film on a semiconductor substrate and arranged substantially in parallel with one another and an extension portion extended from a given data bus of the plurality of data buses wherein the extension portion is spaced away from an adjacent data bus.

18 Claims, 7 Drawing Sheets

SEMICONDUCTOR INTEGRATED CIRCUIT

BACKGROUND OF THE INVENTION

The present invention relates to a semiconductor integrated circuit, particularly to a semiconductor integrated circuit capable of reducing cross talk noise of the semiconductor integrated circuit having a plurality of data buses. The cross talk noise means the change of voltage when a voltage applied to one wiring changes a voltage applied to the other wiring. The cross talk noise is frequently produced when a parasitic capacitance (coupling capacitance) which is produced between one wiring and the other wiring is greater than capacitance (self-wiring capacitance) between the wiring and a substrate, etc. In the Japanese laid-open publication number 5-3260, the distance between the wirings is shortened to reduce the cross talk noise. That is, the coupling capacitance between the wiring is reduced to reduce the cross talk noise.

However, since the distance between the wirings is merely shortened in the technique disclosed in the publication set forth above, an area occupied by the semiconductor integrated circuit increases, and hence it has been desirable to improve the semiconductor integrated circuit capable of reducing the cross talk noise.

SUMMARY OF THE INVENTION

The present invention is a semiconductor integrated circuit for solving the aforementioned problem. A typical semiconductor integrated circuit of the present invention is formed in an insulating film on a semiconductor substrate and comprises a plurality of data buses which are arranged substantially in parallel with one another, and an extension portion or portions formed by being extended from a given data bus or given data buses of the plurality of data buses, wherein the extension portion or portions is or are formed to be spaced away from adjacent data buses.

DETAIL DESCRIPTION OF THE PREFERRED EMBODIMENT

Figure 1:
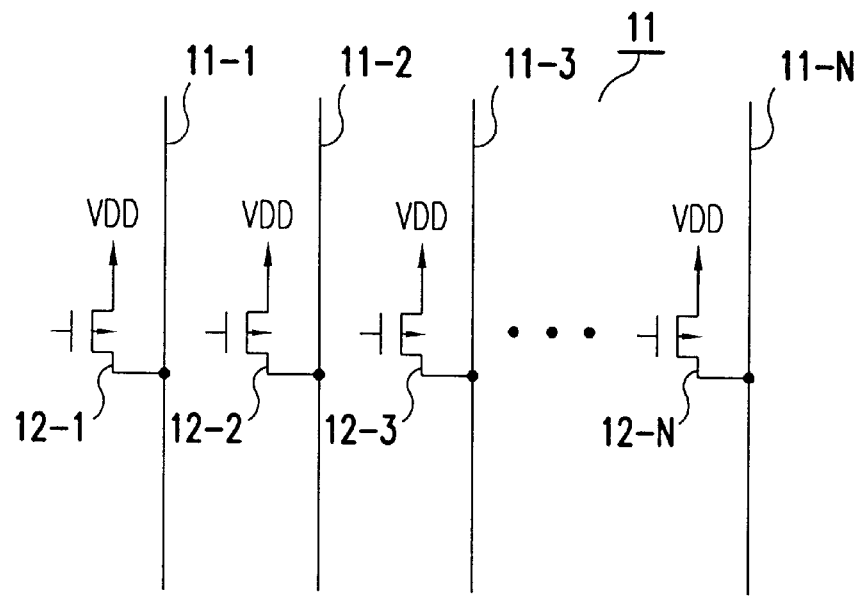
FIG. 1 is a schematic circuit diagram of a semiconductor integrated circuit having a plurality of data buses.
Figure 2:
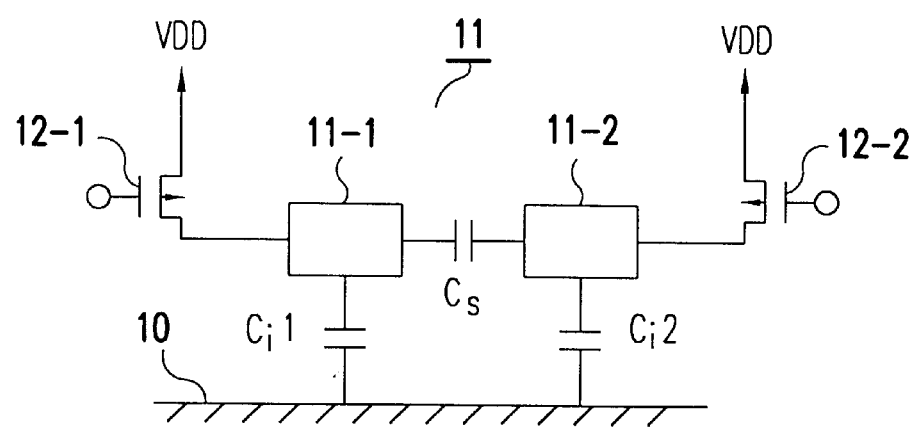
FIG. 2 is a sectional view of the semiconductor integrated circuit of FIG. 1.

FIG. 1 is a schematic circuit diagram of a semiconductor integrated circuit having a plurality of data buses, and FIG. 2 is a sectional view of FIG. 1. The operation of the semiconductor integrated circuit having a plurality of data buses and a cross talk noise are respectively explained with reference to FIGS. 1 and 2.

A data bus 11 is formed on a semiconductor substrate 10 such as a silicon substrate, a well region, etc. by way of an insulating film, etc. The data bus 11 comprises a plurality of wirings 11-1~11-N which are formed of metal, polysilicon, etc. and are arranged in parallel with one another. The data buses (wirings) 11-1~11-N are respectively pulled up weakly at a power supply voltage VDD by pull-up transistors (for example, p-channel type MOS transistors, hereinafter referred to as "PMOSs") 12-1~12-N. Each of the PMOSs 12-1~12-N includes a source connected to the power supply voltage VDD, a drain connected to respective data buses 11-1~11-N, and a gate to which "L" voltage (for example, ground voltage VSS) is applied. The PMOSs 12-1~12-N are brought to an ON state by "L" voltage applied to the gates thereof. The data bus which is pulled up weakly at the power supply voltage VDD is called as a precharge type data bus. The precharge type data bus is pulled up weakly by the PMOSs 12-1~12-N, which is different from a signal line fixed to a constant voltage by a driver circuit only when precharged (general data line). The PMOSs 12-1~12-N which pull up the data buses 11-1~11-N at a high level voltage (hereinafter referred to as "H") have small gm. That is, the PMOSs 12-1~12-N are transistors each having very small driving capacity.

Wiring capacitors C-11~C-1n are disposed between the respective data buses 11-1~11-N and the semiconductor substrate 10, and a capacitor Cs between wirings (hereinafter referred to as an interconnection wiring capacitor Cs) is disposed between adjacent data buses.

Figure 3:
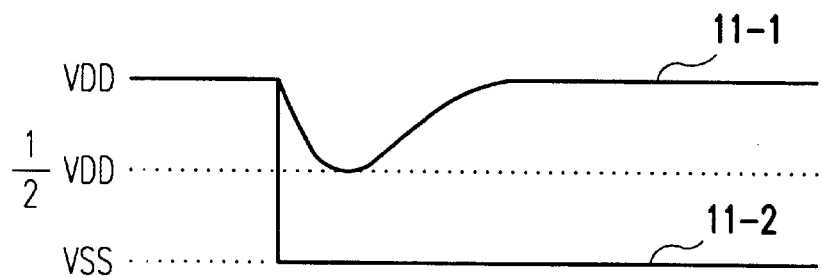
FIG. 3 is a waveform chart of a cross talk noise.

For example, if an element, not shown, connected to the data bus 11-2 allows the voltage of the data bus 11-2 to fall from "H" to a low level voltage hereinafter referred to as "L"), a signal of "L" is transmitted to the data bus 11-2. That is, the voltage of the data bus 11-2 which is pulled up at "H" by the PMOS 12-2 is changed to "L" by an element, not shown. Let's now consider that the data bus 11-1 is an object data bus. When the adjacent data bus 11-2 falls from "H" to "L" as shown in FIG. 3, a cross talk noise is produced in the object data bus 11-1 by the influence of the adjacent data bus 11-2. Such a cross talk noise is produced prominently when the PMOS 12-1 has a low capacity for holding the voltage of the object data bus 11-1. Suppose that capacitance of the wiring capacitor 11 (self-wiring capacitor) of the data bus 11-1 is equal to that of the interconnection wiring capacitor Cs between the object data bus 11-1 and the adjacent data bus 11-2, the cross talk noise which is produced in the object data bus 11-1 is expressed as follows.

$$VDD \times (Cs/(Cs+C11)) = VDD/2 \qquad (1)$$

The expression (1) represents that the cross talk noise which is produced in the object data bus 11-1 is reduced as capacitance of the self-wiring capacitor C11 of the object data bus 11-1 increases.

According to the present invention, in the semiconductor integrated circuit having the precharge type bus 11, capacitance of the self-wiring capacitor C11 between the object data bus (for example, data bus 11-1) and the semiconductor substrate 10 is greater than that of the interconnection wiring capacitor Cs between the object data bus 11-1 and an adjacent data bus thereof (for example, data bus 11-2). Described next is concrete means for increasing capacitance of the self-wiring capacitor.

First Embodiment

Figure 4:
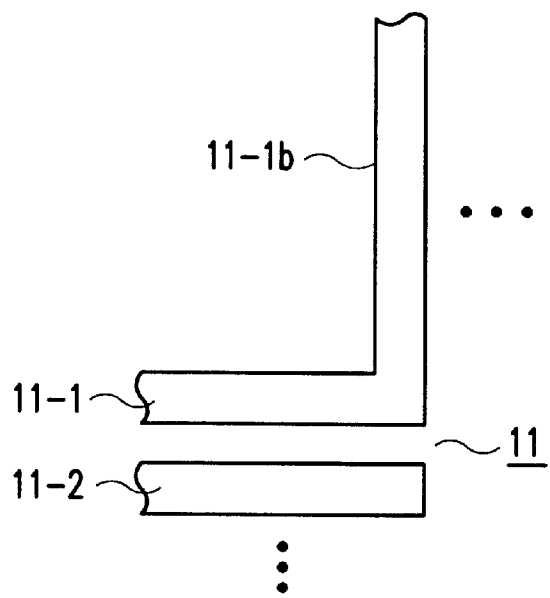
FIG. 4 is a plan view showing a first embodiment of the present invention.

FIG. 4 is a schematic plan view of a semiconductor integrated circuit according to a first embodiment of the present invention. Precharge type data buses 11-1~11-N are formed on a semiconductor substrate 10 by way of an insulating film, etc. in the same manner as shown in FIGS. 1 and 2. The data buses 11-1~11-N are arranged in parallel with one another. PMOSs 12-1~12-N for pulling up a voltage are connected to the data buses 11-1~11-N in the same manner as shown in FIG. 1 (omitted in FIG. 4).

The first embodiment provides an extension portion 11-b on the object data bus 11-1 of FIG. 1. The extension portion 11-b is not adjacent to an adjacent data bus 11-2. The extension portion 11-b is formed in a space of the semiconductor integrated circuit. The extension portion 11-b is sufficiently long compared with the length of the portion where the data bus 11-1 and the data bus 11-2 are adjacent to each other. Capacitance of the self-wiring capacitance produced between the object data bus 11-1 and the semiconductor substrate 10 increases by the extension portion 11-b compared with that of the self-wiring capacitor C11 of FIG. 1 owing to the presence of the extension portion 11-b.

For example, suppose that the voltage of adjacent data bus 11-2 falls from "H" to "L" by an element, not shown, for transmitting a signal to the adjacent data bus 11-2. Accordingly, "H" voltage of the object data bus 11-1 is liable to change to "L" by way of the interconnection wiring capacitor Cs. Since the object data bus 11-1 is longer than that of FIG. 1 by the length of the extension portion 11-b, capacitance of the self-wiring capacitor C11 increases. Meanwhile, since the value of an interconnection wiring capacitor Cs is not changed, a denominator in the expression (1) increases to a greater value. As a result, a cross talk noise is reduced.

As mentioned above, capacitance of the self-wiring capacitance of the object data bus 11-1 increases compared with that of the interconnection wiring capacitor Cs between the data bus 11-1 and the adjacent data bus 11-2 in the first embodiment, the cross talk noise can be reduced. Further, since the extension portion 11-b is formed in the space of the semiconductor integrated circuit, an area occupied by chips (hereinafter referred to as chip area) does not increase by much.

Second Embodiment

Figure 5:
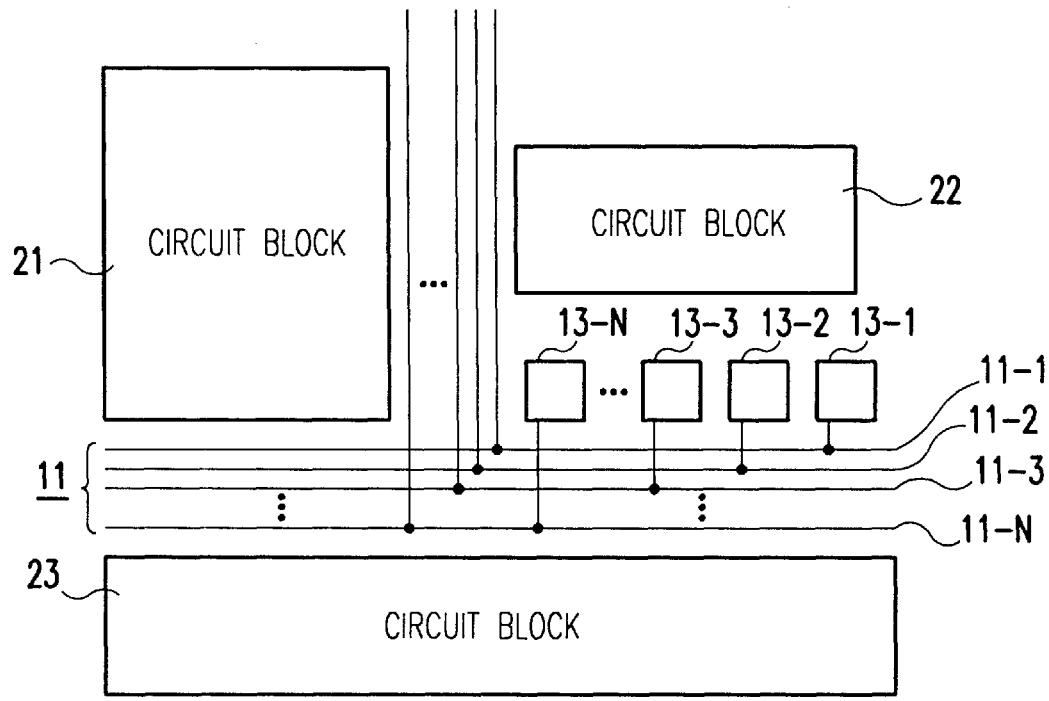
FIG. 5 is a plan view showing a second embodiment of the present invention.

FIG. 5 is a schematic plan view of a semiconductor integrated circuit according to a second embodiment of the present invention. The semiconductor integrated circuit has precharge type data buses 11-1~11-N which are formed on a semiconductor substrate 10 by way of an insulating film, etc. in the same manner as shown in FIGS. 1 and 2. The data buses 11-1~11-N are arranged in parallel with one another. The data buses 11-1~11-N are disposed in a space between a plurality of circuit blocks. PMOSs 12-1~12-N (omitted in FIG. 5) are connected to the data buses 11-1~11-N in the same manner as those shown in FIG. 1.

The second embodiment provides zig-zag or routed wirings 13-1~13-N corresponding to the extension portion 11-b in FIG. 4. The routed wirings 13-1~13-N are formed in advance in a space of the semiconductor integrated circuit at positions between a circuit block forming region and a data bus forming region. The routed wirings 13-1~13-N are respectively connected to the corresponding data buses 11-1~11-N. The constructions of the routed wirings 13-1~13-N are shown, for example, in the plan view of FIG. 6.

Capacitance of the self-wiring capacitance which is produced between the object data bus 11-1 and the semiconductor substrate 10 increases by capacitance of the routed wirings 13-1~13-N compared with that of the self-wiring capacitor C11 in FIG. 2 owing to the presence of routed wirings 13-1~13-N.

For example, suppose that the voltage of the adjacent data bus 11-2 falls from "H" to "L" by an element, not shown, for transmitting a signal to the adjacent data bus 11-2. Accordingly, "H" voltage of the object data bus 11-1 is liable to change to "L" by way of the interconnection wiring capacitor Cs. Since the object data bus 11-1 is longer than that of FIG. 1 by the length of the routed wirings 13-1~13-N, capacitance of the self-wiring capacitor C11 increases. Meanwhile, since the value of the interconnection wiring capacitor Cs is not changed, a denominator in the expression (1) increases to a greater value. As a result, a cross talk noise is reduced.

As mentioned above, since capacitance of the self-wiring capacitance of the object data bus 11-1 increases compared with that of the interconnection wiring capacitor Cs between the data bus 11-1 and the adjacent data bus 11-2 in the second embodiment, the cross talk noise can be reduced. Further, the routed wirings 13-1~13-N are formed in a space of the semiconductor integrated circuit at positions between a circuit block forming region and a data bus forming region, a chip area does not increase by much.

It is not necessary to connect the routed wirings 13-1~13-N to all the data buses. Since the routed wirings 13-1~13-N are formed in advance in the space of the semiconductor integrated circuit, appropriate routed wirings 13-1~13-N can be appropriately connected to a data bus only of the data buses 11-1~11-N, which data bus needs to take countermeasures against the cross talk noise.

Third Embodiment

Figure 7:
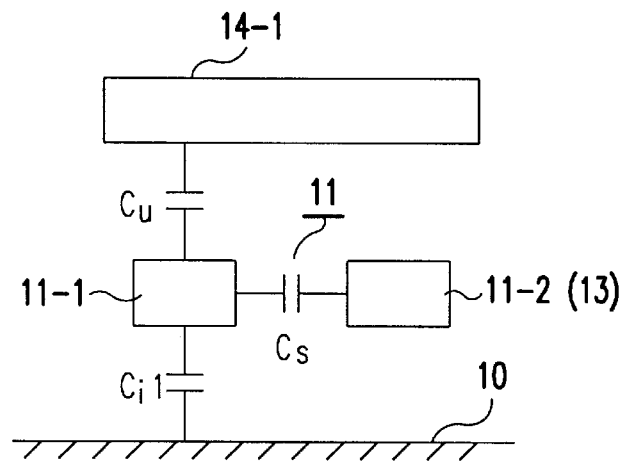
FIG. 7 is a sectional view showing a third embodiment of the present invention.
Figure 8:
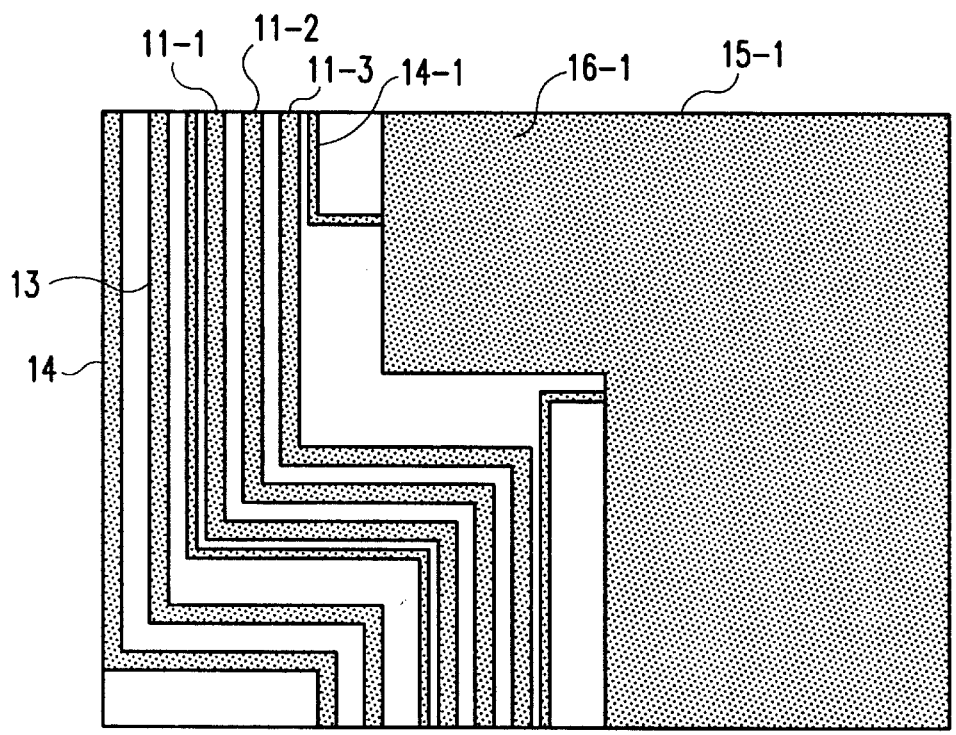
FIG. 8 is a plan view showing the third embodiment of the present invention.

FIG. 7 is a schematic sectional view of a semiconductor integrated circuit according to a third embodiment of the present invention. FIG. 8 is a plan view of the semiconductor integrated circuit of FIG. 7.

The semiconductor integrated circuit has precharge type data buses 11-1~11-N on a semiconductor substrate 10 by way of an insulating film, etc. in the similar manner as shown in FIGS. 1 and 2. The data buses 11-1 and 11-2 are shown in FIG. 7 and the data buses 1-1~11-3 are shown in FIG. 8. The data buses 11-1~11-N are arranged in parallel with one another. PMOSs 12-1~12-N for pulling up voltages (omitted in FIGS. 7 and 8) are respectively connected to the data buses 11-1~11-N in the similar manner as shown in FIG. 1. Other signal lines 13 and 14 are provided at the outside of the data buses 11-1~11-N.

The data buses 11-1~11-3, the signal lines 13 and 14, and a stable voltage layer 15-1 are respectively formed by a first wiring layer made of aluminum, etc. For example, the stable voltage layer is a ground voltage layer. A ground voltage is applied to the stable voltage layer for the entire semiconductor integrated circuit. A conductive layer 14-1 serving as a second wiring layer made of polysilicon, etc. is formed over the data buses 11-1~11-3 by way of an insulating film, etc. In FIG. 8, the conductive layer 14-1 is shown by a solid line at the edge thereof alone for facilitating the explanation thereof. The conductive layer 14-1 is connected to the stable voltage layer 15-1 by way of a plurality of contact holes 16-1. The contact holes 16-1 are shown by black squares in FIG. 8.

Added to the object data bus 11-1 are capacitance of a self-wiring capacitor C11 which is produced between the data bus 11-1 and the semiconductor substrate 10 and capacitance of a capacitor Cu which is produced between the data bus 11-1 and the conductive layer 14-1 and capacitance of owing to the presence of the conductive layer 14-1.

For example, suppose that the voltage of the adjacent data bus 11-2 falls from "H" to "L" by an element, not shown, for transmitting a signal to the adjacent data bus 11-2. Accordingly, "H" voltage of the object data bus 11-1 is liable to change to "L" by way of an interconnection wiring capacitor Cs. Since the object data bus 11-1 increases in self-wiring capacitance by capacitance of the capacitor Cu compared with that of the object data bus 11-1 of FIG. 1. On the other hand, since the value of the interconnection wiring capacitor Cs is not changed, a denominator in the expression (1) increases to a greater value. As a result, a cross talk noise is reduced.

Since capacitance of the self-wiring capacitance of the object data bus 11-1 increases compared with that of the interconnection wiring capacitor Cs between the data bus 11-1 and the adjacent data bus 11-2 in the third embodiment, the cross talk noise can be reduced. Further, the conductive layer 14-1 is disposed over the data bus forming region to increase capacitance of the self-wiring capacitance, a chip area does not increase by much. Still further, since the conductive layer 14-1 is formed over the data bus region, there is an advantage that it can shield against an electromagnetic emission noise (hereinafter referred to as "EMI noise") which enters from the upper portion of the data buses. As a result, the data buses are protected form the EMI noise.

If the stable voltage layer 15-1 is a ground voltage layer or a power supply voltage layer of the entire semiconductor integrated circuit, it is possible to prevent a power supply noise which is produced in the stable voltage layer 15-1 from being transmitted to the data buses, if a high resistor is connected between the stable voltage layer 15-1 and conductive layer 14-1.

It is not necessary to form the conductive layer 14-1 on all of the data buses. The conductive layer 14-1 may be formed over a data bus of the data buses 11-1~11-N, which data bus needs to take countermeasures against the cross talk noise. Although the data bus 11-2 is defined as the adjacent wiring, the adjacent wiring may be the signal line 13 as shown in (13) in FIG. 7. In this case, the signal line 13 is not positioned under the conductive layer 14-1.

Fourth Embodiment

Figure 9:
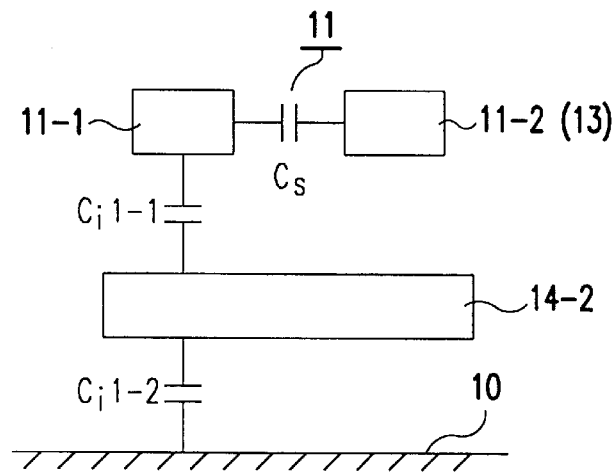
FIG. 9 is a sectional view showing a fourth embodiment of the present invention.
Figure 10:
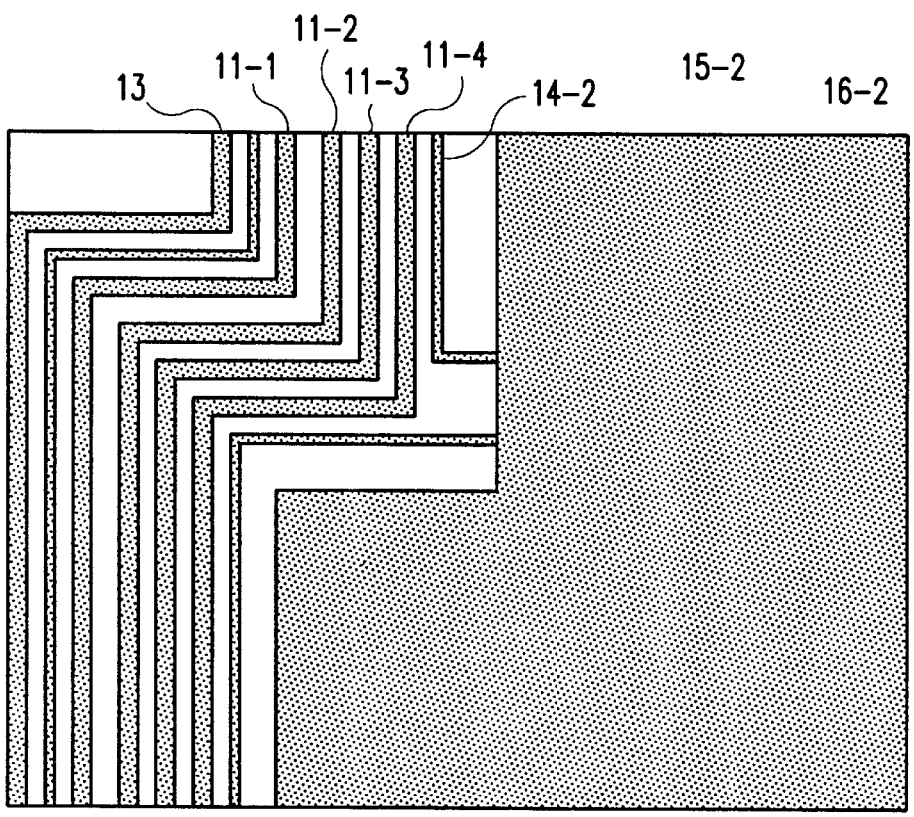
FIG. 10 is a plan view showing the fourth embodiment of the present invention.

FIG. 9 is a schematic sectional view of a semiconductor integrated circuit according to a fourth embodiment of the present invention. FIG. 10 is a plan view of the semiconductor integrated circuit of FIG. 9.

The semiconductor integrated circuit has the precharge type data buses 11-1~11-N on a semiconductor substrate 10 by way of an insulating film, etc. in the similar manner as shown in FIGS. 1 and 2. The data buses 111 and 11-2 are shown in FIG. 9. The data buses 11-1~11-3 are shown in FIG. 10. The data buses 11-1~11-N are arranged in parallel with one another. PMOSs 12-1·12-N for pulling up voltages (omitted in FIGS. 9 and 10) are respectively connected to the data buses 11-1~11-N in the similar manner as shown in FIG. 1. Another signal line 13 is provided at the outside of the data buses 11-1~11-N.

The data buses 11-1~11-3, the signal line 13, and a stable voltage layer 15-2 are respectively formed by a second wiring layer made of aluminum, etc. For example, the stable voltage layer is a power supply voltage layer. A power supply voltage is applied to the stable voltage layer for the entire semiconductor integrated circuit. A conductive layer 14-2 serving as a first wiring layer made of polysilicon, etc. is formed under the data buses 11-1~11-3 by way of an insulating film, etc. In FIG. 10, the conductive layer 14-2 is shown by a solid line at the edge thereof alone for facilitating the explanation thereof. The conductive layer 14-2 is connected to the stable voltage layer 15-2 by way of a plurality of contact holes 16-2 (the contact holes 16-2 are shown by squares each having x therein in FIG. 10).

Added to the object data bus 11-1 are capacitance of a self-wiring capacitor C11 which is produced between the data bus 11-1 and the conductive layer 14-2 and capacitance of a capacitor C12 which is produced between the conductive layer 14-2 and the semiconductor substrate 10 owing to the presence of the conductive layer 14-2.

For example, suppose that the voltage of the adjacent data bus 11-2 falls from "H" to "L" by an element, not shown, for transmitting a signal to the adjacent data bus 11-2. Accordingly, "H" voltage of the object data bus 11-1 is liable to change to "L" by way of an interconnection wiring capacitor Cs. Since the object data bus 11-1 increases in self-wiring capacitance by capacitance of the capacitor C11 or C12 compared with that of the object data bus 11-1 of FIG. 1. Meanwhile, since the value of the interconnection wiring capacitor Cs is not changed, a denominator in the expression (1) increases to a greater value. As a result, a cross talk noise is reduced.

Since capacitance of the self-wiring capacitance of the object data bus 11-1 increases compared with that of the interconnection wiring capacitor Cs between the data bus 11-1 and the adjacent data bus 11-2 in the fourth embodiment, the cross talk noise can be reduced. Further, the conductive layer 14-2 is disposed under the data bus forming region to increase the self-wiring capacitance, a chip area does not increase by much. Still further, since the conductive layer 14-2 is formed under the data bus region, there is an advantage that it can shield against the noise which enters from the lower portion of the data buses (semiconductor substrate 10). As a result, the data buses are difficult to be susceptible to the noise.

If the stable voltage layer 15-2 is a ground voltage layer or power supply voltage layer of the entire semiconductor integrated circuit, it is possible to prevent a power supply noise which is produced in the stable voltage layer 15-2 from being transmitted to the data buses, if a high resistor is connected between the stable voltage layer 15-2 and conductive layer 14-2.

It is not necessary to form the conductive layer 14-2 on all of the data buses. The conductive layer 14-2 may be formed over a data bus of the data buses 11-1~11-N, which data bus needs to take countermeasures against the cross talk noise. Although the data bus 11-2 is defined as the adjacent wiring, the adjacent wiring may be the signal line 13 as shown in (13) in FIG. 9. In this case, the signal line 13 is not positioned under the conductive layer 14-2.

Fifth Embodiment

Figure 11:
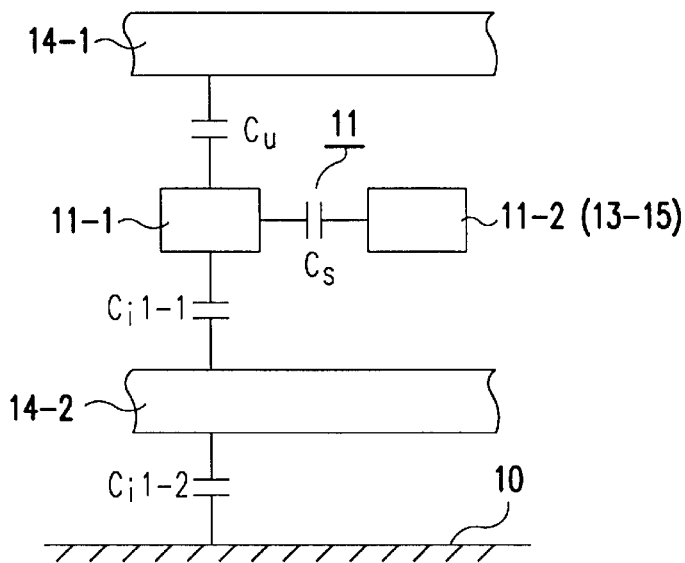
FIG. 11 is a sectional view showing a fifth embodiment of the present invention.
Figure 12:
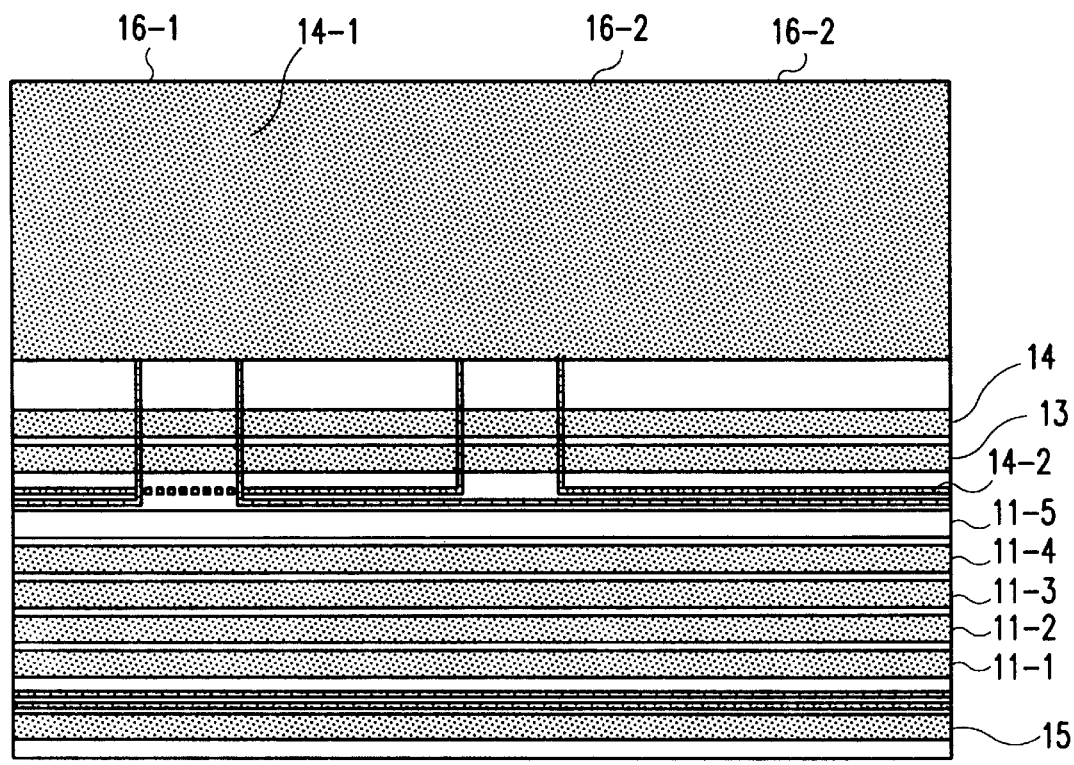
FIG. 12 is a plan view showing the fifth embodiment of the present invention.

FIG. 11 is a schematic sectional view of a semiconductor integrated circuit according to a fifth embodiment of the present invention. FIG. 12 is a plan view of the semiconductor integrated circuit of FIG. 11.

The semiconductor integrated circuit has precharge type data buses 11-1~11-N on a semiconductor substrate 10 by way of an insulating film, etc. in the similar manner as shown in FIGS. 1 and 2. The data buses 11-1 and 11-2 are shown in FIG. 11. The data buses 11-1~11-5 are shown in FIG. 12. The data buses 11-1~1 1-N are arranged in parallel with one another. PMOSs 12-1~12-N for pulling up voltages (omitted in FIGS. 11 and 12) are respectively connected to the data buses 11-1~11-N in the similar manner as shown in FIG. 1. Other signal lines 13 to 15 are provided at the outside of the data buses 11-1~11-N.

The data buses 11-1~11-5, the signal lines 13 to 15, and a stable voltage layer 15-12 are respectively formed by a second wiring layer made of aluminum, etc. For example, the stable voltage layer is a ground voltage layer. A ground voltage is applied to the stable voltage layer for the entire semiconductor integrated circuit. A conductive layer 14-2 serving as a first wiring layer made of polysilicon, etc. is formed under the data buses 11-1~11-5 by way of an insulating film, etc. In FIG. 12, the conductive layer 14-2 is shown by a solid line at the edge thereof alone for facilitating the explanation thereof. The conductive layer 14-2 is connected to the stable voltage layer 15-12 by way of a plurality of contact holes 16-2 (the contact holes 16-2 are shown by squares each having x therein in FIG. 12).

Meanwhile, a conductive layer 14-1 serving as a third wiring layer made of polysilicon, etc. is formed over the data buses 11-1~11-5 by way of an insulating film, etc. In FIG. 12, the conductive layer 14-1 is shown by a solid line at the edge thereof alone for facilitating the explanation thereof. The conductive layer 14-1 is connected to the stable voltage layer 15-12 by way of a plurality of contact holes 16-1 (the contact holes 16-1 are shown by block squares FIG. 12).

Added to the object data bus 11-1 are capacitance of a self-wiring capacitor C11-1 which is produced between the data bus 11-1 and the conductive layer 14-2, capacitance of a self-wiring capacitor Cu which is produced between the data bus 11-1 and the conductive layer 14-1, and capacitance of a capacitor C11-2 which is produced between the conductive layer 14-2 and the semiconductor substrate 10 owing to the presence of the conductive layers 14-1 and 14-2.

For example, suppose that the voltage of the adjacent data bus 11-2 falls from "H" to "L" by an element, not shown, for transmitting a signal to the adjacent data bus 11-2. Accordingly, "H" voltage of the object data bus 11-1 is liable to change to "L" by way of an interconnection wiring capacitor Cs. The object data bus 11-1 increases in self-wiring capacitance as mentioned above. Meanwhile, since the value of the interconnection wiring capacitor Cs is not changed, a denominator in the expression (1) increases to a greater value. As a result, a cross talk noise is reduced.

Since the self-wiring capacitance of the object data bus 11-1 increases compared with that of the interconnection wiring capacitor Cs between the data bus 11-1 and the adjacent data bus 11-2 in the fifth embodiment, the cross talk noise can be reduced. Further, since the conductive layer 14-1 is disposed over the data bus forming region to increase the self-wiring capacitance, a chip area does not increase by much, and the conductive layer 14-2 is formed under the data bus region, a chip area does not increase so much. Still further, since the conductive layers 14-1 and 14-2 are formed to sandwich the data buses, there is an advantage that they can shield against the noise which enters from the outside of the semiconductor substrate 10 and the semiconductor integrated circuit. As a result, the data buses are not susceptible to the noise.

If the stable voltage layer 15-12 is a ground voltage layer or a power supply voltage layer of the entire semiconductor integrated circuit, it is possible to prevent a power supply noise which is produced in the stable voltage layer 15-12 from being transmitted to the data buses if a high resistor is connected between the stable voltage layer 15-12, and the conductive layers 14-1 and 14-2.

It is not necessary to form the conductive layers 14-1 and 14-2 over and under the entire data buses. The conductive layers 14-1 and 14-2 may be formed over a data bus of the data buses 11-1~11-N, which data bus needs to take countermeasures against the cross talk noise. Although the data bus 11-2 is defined as the adjacent wiring, the adjacent wiring may be the signal lines 13 to 15 as shown in (13) in FIG. 11. In this case, the signal lines 13 to 15 are not positioned over or under the conductive layer 14-2.

Sixth Embodiment

Figure 13:
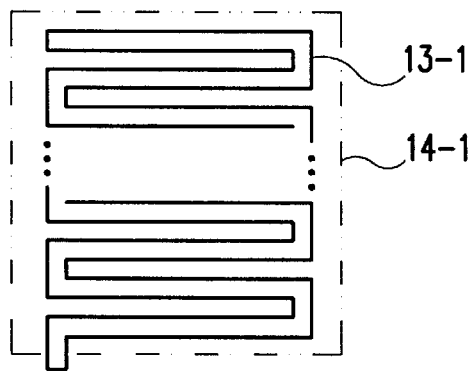
FIG. 13 is a plan view showing a sixth embodiment of the present invention.

FIG. 13 is a schematic plan view of a semiconductor integrated circuit according to a sixth embodiment of the present invention. Components which are common to those of the second embodiment are denoted by the reference numerals.

Figure 6:
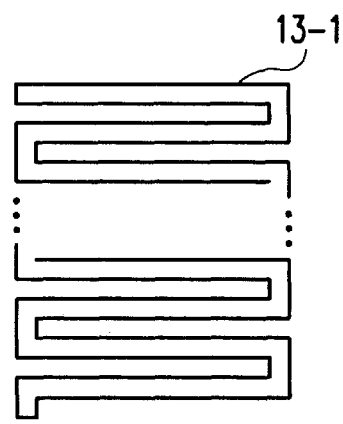
FIG. 6 is a plan view showing the second embodiment of the present invention.

A routed wiring 13-1 is provided for increasing the self-wiring capacitance in the same manner as shown in FIG. 6. The routed wiring 13-1 is formed, for example, by a it wiring layer on the semiconductor substrate 10. A second conductive layer 14-1, voltage which is kept at an stable value, is formed in the same manner as shown in FIG. 7. The self-wiring capacitance of an object data bus is greater than that in FIG. 6 owing to the presence of the conductive layer 14-1. With such an arrangement, a cross talk noise produced in the object data bus 11-1 can be reduced without increasing a chip area.

The conductive layer 14-1 may be formed under the routed wiring 13-1.

The present invention is not limited to the embodiments set forth above but may be modified variously. There are, for example, the following modifications (a) to (c).

(a) The data buses may be arranged in the manner other than those illustrated above.

(b) The conductive layers 14-1 and 14-2 for increasing the self-wiring capacitance may be formed separately for respective corresponding buses.

Figure 14:
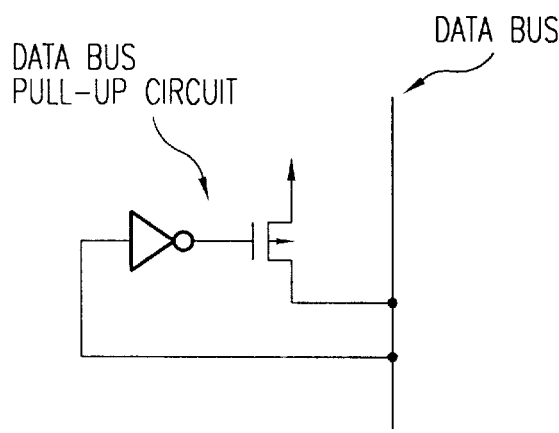
FIG. 14 is a view showing another example of data bus pull-up means.
Figure 15:
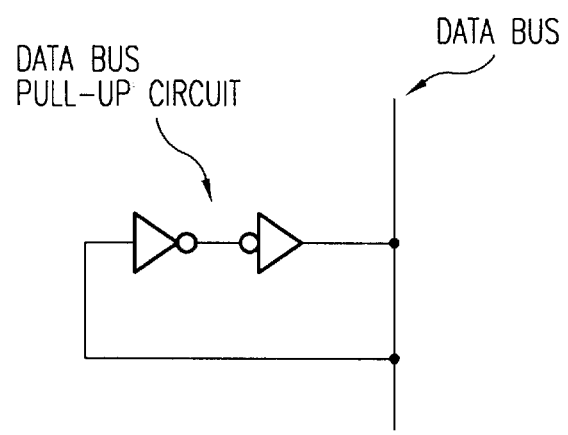
FIG. 15 is a view showing another example of data bus pull-up means.

(c) Means for pulling up the data buses may be circuits as shown in FIGS. 14 and 15 other than PMOSs as set forth above.

What is claimed is:

1. A semiconductor integrated circuit comprising:
   a plurality of data buses which are formed in an insulating layer formed over a semiconductor substrate, which are arranged substantially in parallel with one another and which are pulled up to a power supply voltage level, wherein voltage levels of said data buses are changed to a ground voltage level or are maintained at the power supply voltage level according to data applied thereto; and
   a bent wiring connected to each of said plurality of data buses requiring reduction in crosstalk noise, said bent wiring having a plurality of bent portions.

2. The semiconductor integrated circuit according to claim 1, wherein said bent wiring has a zig-zag form.

3. The semiconductor integrated circuit according to claim 1, wherein the bent wiring is provided in a space between a circuit block and other circuit blocks.

4. A semiconductor integrated circuit comprising:
   a plurality of data buses which are formed by a first wiring layer formed over a semiconductor substrate, which are arranged substantially in parallel with one another and which are pulled up to a power supply voltage level, wherein voltage levels of said data buses are changed to a ground voltage level or are maintained at the power supply voltage level according to data applied thereto;

a stable voltage wiring which is formed by the first wiring layer and which is supplied with a substantially stable voltage level; and a conductive portion which includes at least one of a top wiring layer positioned over each data bus of the plurality of data buses which requires a reduction in crosstalk and a bottom wiring layer positioned under each data bus of the plurality of data buses which requires a reduction in crosstalk, so that the conductive portion overlaps each of said data buses which requires a reduction in crosstalk, said conductive portion being connected to said stable voltage wiring.

5. The semiconductor integrated circuit according to claim 4, wherein said conductive layer is a layer including polysilicon.

6. The semiconductor integrated circuit according to claim 4, wherein said data buses are pulled up to a power supply voltage level by pull-up means.

7. A semiconductor integrated circuit comprising:

a plurality of data buses which are formed in an insulating film of a semiconductor substrate, and arranged substantially in parallel with one another;

an extension portion extending from each data bus of said plurality of data buses requiring reduction in crosstalk noise, said extension portion being of sufficient surface area such that a self-wiring capacitance between a data bus requiring reduction in crosstalk noise and the semiconductor substrate is greater than an interconnection capacitance between the data bus requiring reduction in crosstalk noise and an adjacent data bus; and a conductive portion which is formed in the insulating film, the conductive portion including at least one of a top conductive layer positioned over the extension portion and a bottom conductive layer positioned under the extension portion, the conductive portion being impressed at a substantially stable voltage level.

8. The semiconductor integrated circuit according to claim 7, wherein each extension portion comprises a bent wiring having a plurality of bent portions.

9. The semiconductor integrated circuit according to claim 8, wherein each bent wiring is provided in a space between a circuit block and other circuit blocks.

10. The semiconductor integrated circuit according to claim 9, wherein a number of bent wirings provided is equal to a number of said plurality of data buses, and wherein only bent wirings serving as the extension portions are connected to data buses.

11. The semiconductor integrated circuit according to claim 7, wherein said data buses are pulled up to a power supply voltage level by pull-up means.

12. The semiconductor integrated circuit according to claim 7, wherein said top conductive layer is formed in the insulating film positioned over the data bus requiring reduction in crosstalk noise and said bottom conductive layer is formed in the insulating film positioned under the data bus requiring reduction in crosstalk noise.

13. The semiconductor integrated circuit according to claim 7, wherein the substantially stable voltage level is a power supply voltage or a ground voltage of the semiconductor integrated circuit.

14. The semiconductor integrated circuit according to claim 13, further comprising contact holes connecting said conductive portion to a power supply wiring or a ground wiring to which said power supply voltage or the ground voltage is supplied [by way of contact holes.

15. The semiconductor integrated circuit according to claim 7, wherein said conductive portion includes polysilicon.

16. A semiconductor integrated circuit comprising:

a plurality of data buses which are formed in an insulating layer formed over a semiconductor substrate and are arranged substantially in parallel with one another; and a conductive portion adjacent each data bus of said plurality of data buses requiring reduction in cross-talk noise, said conductive portion being of sufficient surface area such that a self-wiring capacitance between a data bus requiring reduction in crosstalk noise and the semiconductor substrate is greater than an interconnection capacitance between the data bus requiring reduction in cross-talk noise and an adjacent data bus.

17. The semiconductor integrated circuit according to claim 16, wherein said conductive portion is an extension portion extending from each data bus requiring reduction in crosstalk noise.

18. The semiconductor integrated circuit according to claim 17, wherein said extension portion extends away from the adjacent data bus.

* * * * *